US 8,710,631 B2

(12) United States Patent
Kugler

(10) Patent No.: US 8,710,631 B2
(45) Date of Patent: Apr. 29, 2014

(54) SURFACE MODIFICATION

(75) Inventor: Thomas Kugler, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 13/386,996

(22) PCT Filed: Jul. 29, 2010

(86) PCT No.: PCT/GB2010/001440
§ 371 (c)(1),
(2), (4) Date: Apr. 10, 2012

(87) PCT Pub. No.: WO2011/015808
PCT Pub. Date: Feb. 10, 2011

(65) Prior Publication Data
US 2012/0187548 A1 Jul. 26, 2012

(30) Foreign Application Priority Data
Aug. 4, 2009 (GB) .................................. 0913485.9

(51) Int. Cl.
H01L 21/312 (2006.01)
(52) U.S. Cl.
USPC ............................ 257/632; 257/635; 257/642
(58) Field of Classification Search
USPC ........................................................ 257/632
See application file for complete search history.

(56) References Cited

U.S. PATENT DOCUMENTS

| 5,328,946 A | 7/1994 | Tuminello et al. |
| 5,403,437 A | 4/1995 | Beratan et al. |
| 6,833,153 B1 * | 12/2004 | Roorda et al. ............... 427/2.24 |
| 2005/0104058 A1 | 5/2005 | Veres et al. |
| 2006/0151781 A1 * | 7/2006 | Kim et al. ........................ 257/40 |
| 2009/0035565 A1 | 2/2009 | Serbutoviez et al. |

FOREIGN PATENT DOCUMENTS

| EP | 1350575 A2 * | 10/2003 |
| WO | WO-2007/145293 A1 | 12/2007 |
| WO | WO-2009/053089 A1 | 4/2009 |
| WO | WO-2009/121672 A1 | 10/2009 |

OTHER PUBLICATIONS

Battaglia et al., "The Electric Quadrupole Moments of Benzene and Hexafluorobenzene," *Chem. Phys. Lett.*, 78:421-423 (1981).

Costello et al., "Surface-Selective Introduction of Specific Functionalities onto Poly(tetrafluoroethylene)," *Macromolecules*, 20(11):2819-2828 (1987).

(Continued)

*Primary Examiner* — Andy Huynh
*Assistant Examiner* — Sitaramarao S Yechuri
(74) *Attorney, Agent, or Firm* — Marshall, Gerstein & Borun LLP

(57) ABSTRACT

A method of modifying a fluorinated polymer surface comprising the steps of depositing a first layer on at least a portion of the fluorinated polymer surface, the first layer comprising a first polymer, the first polymer being a substantially perfluorinated aromatic polymer; and depositing a second layer on at least a portion of the first layer, the second layer comprising a second polymer, the second polymer being an aromatic polymer having a lower degree of fluorination than said first polymer, whereby the second layer provides a surface on to which a substance having a lower degree of fluorination than the first polymer, e.g. a non-fluorinated substance is depositable.

56 Claims, 1 Drawing Sheet

(56) References Cited

OTHER PUBLICATIONS

Ha et al., "Adhesion to Sodium Naphthalenide Treated Fluoropolymers Part I—Analytical Methodology," *Journal of Adhesion,* 33(3):169-184 (1991).

Hung et al., "Functionalization and Metallization of Fluoropolymer Surfaces Through Reduction," *Journal of Applied Polymer Science,* 55(4):549-559 (1995).

Inagaki et al., "Improved Adhesion of Poly(tetrafluoroethylene) by $NH_3$-Plasma Treatment," *Journal of Adhesion Science and Technology,* 3(8):637-649 (1989).

Kaplan, "Cold Gas Plasma and Silanes," Fourth International Symposium on Silanes and Other Coupling Agents (Jun. 2003).

Kinbara et al., "Effect of Plasma Treatment of PTFE Substrates on the Adhesion Characteristics of Vacuum-Deposited Au Films," *Journal of Adhesion Science and Technology,* 7(5):457-466 (1993).

Lin et al., "Investigation of Wet Chemical-Treated Poly(tetrafluoroethylene) Surface and its Metallization with SIMS, XPS and Atomic Force Microscopy," *Journal of Adhesion Science and Technology,* 14(1):1-14 (2000).

Marchesi et al., "Adhesion to Sodium Naphthalenide Treated Fluoropolymers. Part II. Effects of Treatment Conditions and Fluoropolymer Structure," *Journal of Adhesion,* 36(1):55-69 (1991).

Search Report for Application No. GB0913485.9, dated Dec. 30, 2009.

Wang et al., "Fluorocarbon Surfactant Polymers: Effect of Perfluorocarbon Branch Density on Surface Active Properties," *Marcomolecules,* 37(9):3353-3359 (2004).

Williams et al., "Structure of the Lowest Temperature Phase of the Solid Benzene-Hexafluorobenzene Adduct," *Angew. Chem. Int. Ed. Engl.,* 31:1655-1657 (1992).

International Preliminary Report on Patentability for Application No. PCT/GB2010/001440, dated Feb. 7, 2012.

International Search Report and Written Opinion for Application No. PCT/GB2010/001440, dated Dec. 13, 2010.

\* cited by examiner

SURFACE MODIFICATION

BACKGROUND OF THE INVENTION

1. Field of the Invention

The present invention relates to the modification of surfaces, in particular to the modification of fluorinated polymer surfaces so as to enable the deposition of non-fluorinated substances thereon. The invention may be especially useful in the field of thin film devices, such as thin film transistors.

2. Related Technology

Transistors can be divided into two main types: bipolar junction transistors and field-effect transistors. Both types share a common structure comprising three electrodes with a semiconductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semiconductive material which conducts positive charge carriers (holes) or negative charge carriers (electrons) respectively. The semiconductive material may be selected according to its ability to accept, conduct, and donate charge. The ability of the semiconductive material to accept, conduct and donate holes or electrons can be enhanced by doping the material.

For example, a p-type transistor device can be formed by selecting a semiconductive material which is efficient at accepting, conducting, and donating holes, and selecting a material for the source and drain electrodes which is efficient at injecting and accepting holes from the semiconductive material. Good energy-level matching of the Fermi-level in the electrodes with the highest occupied molecular orbital (HOMO) level of the semiconductive material can enhance hole injection and acceptance. In contrast, an n-type transistor device can be formed by selecting a semiconductive material which is efficient at accepting, conducting, and donating electrons, and selecting a material for the source and drain electrodes which is efficient at injecting electrons into, and accepting electrons from, the semiconductive material. Good energy-level matching of the Fermi-level in the electrodes with the lowest unoccupied molecular orbital (LUMO) level of the semiconductive material can enhance electron injection and acceptance.

Transistors can be formed by depositing the components in thin films to form a thin film transistor (TFT). When an organic material is used as the semiconductive material in such a device, it is known as an organic thin film transistor (OTFT).

OTFTs may be manufactured by low cost, low temperature methods such as solution processing. Moreover, OTFTs are compatible with flexible plastic substrates, offering the prospect of large-scale manufacture of OTFTs on flexible substrates in a roll-to-roll process.

With reference to FIG. 1, the general architecture of a bottom-gate organic thin film transistor (OTFT) comprises a gate electrode 12 deposited on a substrate 10. An insulating layer 11 of dielectric material is deposited over the gate electrode 12 and source and drain electrodes 13, 14 are deposited over the insulating layer 11 of dielectric material. The source and drain electrodes 13, 14 are spaced apart to define a channel region therebetween located over the gate electrode 12. An organic semiconductor (OSC) material 15 is deposited in the channel region for connecting the source and drain electrodes 13, 14. The OSC material 15 may extend at least partially over the source and drain electrodes 13, 14.

Alternatively, it is known to provide a gate electrode at the top of an organic thin film transistor to form a so-called top-gate organic thin film transistor. In such an architecture, source and drain electrodes are deposited on a substrate and spaced apart to define a channel region therebetween. A layer of an organic semiconductor material is deposited in the channel region to connect the source and drain electrodes and may extend at least partially over the source and drain electrodes. An insulating layer of dielectric material is deposited over the organic semiconductor material and may also extend at least partially over the source and drain electrodes. A gate electrode is deposited over the insulating layer and located over the channel region.

An organic thin film transistor can be fabricated on a rigid or flexible substrate. Rigid substrates may be selected from glass or silicon and flexible substrates may comprise thin glass or plastics such as poly(ethylene-terephthalate) (PET), poly(ethylene-naphthalate) (PEN), polycarbonate and polyimide.

The organic semiconductive material may be made solution processable through the use of a suitable solvent. Exemplary solvents include mono- or poly-alkylbenzenes such as toluene and xylene; tetralin; and chloroform. Preferred solution deposition techniques include spin coating and ink jet printing. Other solution deposition techniques include dip-coating, roll printing and screen printing.

The length of the channel defined between the source and drain electrodes may be up to 500 microns, but preferably the length is less than 200 microns, more preferably less than 100 microns, most preferably less than 20 microns.

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of so-called "orthogonal" solvents for example use of a solvent for deposition of the uppermost layer that does not dissolve the underlying layer; or/and cross linking of the underlying layer.

The thickness of the insulating layer is preferably less than 2 micrometers, more preferably less than 500 nm.

It is known that the dielectric material may comprise a fluorinated polymer. Suitable fluorinated polymers include perfluoro cyclo oxyaliphatic polymer (CYTOP), perfluoro-alkoxy polymer resin (PFA), fluorinated ethylene-propylene (FEP), polyethylenetetrafluoroethylene (ETFE), polyvinylfluoride (PVF), polytetrafluoroethylene (PTFE), polyethylenechlorotrifluoroethylene (ECTFE), polyvinylidene fluoride (PVDF), polychlorotrifluoroethylene (PCTFE), perfluoro elastomers (FFKM) such as Kalrez® or Tecnoflon®, fluoro elastomers such as Viton®, Perfluoropolyether (PFPE) and a polymer of tetrafluoroethylene, hexafluoropropylene and vinylidene fluoride (THV).

Fluorinated polymers are an attractive choice for the dielectric material, particularly in the field of organic thin film transistors (OTFTs), because they may possess a number of favorable properties including:—
 (i) Excellent spin coating properties, for instance: (a) wetting on a wide variety of surfaces; and (b) film formation, with the option of doing multi-layer coatings.
 (ii) Chemical inertness.
 (iii) Quasi-total solvent orthogonality: consequently, the risk of the OSC being dissolved by the solvent used for spin-coating the dielectric is minimal, as is the risk of interaction with the solvent used to inkjet the gate electrodes.
 (iv) High hydrophobicity: this can be advantageous because it results in low water uptake and low mobility of ionic contaminants in the fluorinated polymer dielectric (low hysteresis).

However, the use of fluorinated polymers as the dielectric material in OTFTs presents a number of challenges.

First, it is difficult to achieve good wetting of substances such as conducting polymers which are to be deposited on to the fluorinated polymer. For instance, in a top-gate organic thin film transistor (OTFT), conducting inks comprising one or more conducting polymers may be used to inkjet print the gate electrodes onto the insulating layer (more commonly used are metal colloid inks for printing the gate electrodes in top gate devices); however, this can be difficult when the insulating layer comprises a fluorinated polymer.

Second, adhesion of the substance, e.g. a conducting ink, to the fluorinated polymer surface may be unsatisfactory during and/or after post-deposition drying and annealing.

Third, a glue may be used when it is desired to encapsulate a device; however, achieving good adhesion between the glues that are most commonly used and a fluorinated polymer surface may be difficult.

A number of approaches have been taken in order to try to alleviate or solve one or more of these problems.

A first category of approach may be generally termed reactive treatments. In one example of such a treatment, a fluorinated polymer is treated using sodium in liquid ammonia or sodium naphthalene in THF, which act as strong reducing agents, resulting in the cleavage of C—F bonds and the formation of sodium fluoride, carbon radicals and carbanions. Defluorination can occur rapidly.

In a study, Ha and co-workers [Journal of Adhesion 33, No. 3, p. 169-84 (1991)] showed that sodium naphthalenide treatment of perfluoroalkoxy copolymer (PFA) introduced unsaturation to a depth of 112 nm, while oxygen-containing functional groups such as —OH, —C=O and —COOH were concentrated in the first few nm.

In another reported study, Marchesi at al [Journal of Adhesion 36, No. 1, p. 55-69 (1991)] treated various fluorinated polymers with sodium naphthalenide in THF at ambient temperature. They determined that the treated depth was within the range of 112-150 nm for PFA, FEP and PTFE.

These treatments have been reported to result in a "groovelike" topography [Lin et al., Journal of Adhesion Science and Technology 14, No 1, p. 1-14 (2000)].

In another study, Castello and McCarthy [Macromolecules 20, No. 11, p. 2819-28 (1987)] found that the reduction of PTFE by the potassium salt of the benzoin dianion in dimethyl sulfoxide (DMSO) results in a slight coloration of the PTFE surface and a considerable enhancement of the surface energy.

It has also been reported that although this treatment could successfully be applied to a range of fluoropolymers, Teflon® AF (a copolymer of TFE and perfluoro 2,2-dimethyl-1,3dioxole) was totally inert [Hung et al., Journal of Applied Polymer Science 55, No. 4, p. 549-59 (1995)].

It will be readily appreciated that wet-chemical reductive treatments typically involve the use of highly reactive chemicals, which may be dangerous or difficult to handle. The reductive treatments described above all involve use of a strong electron donor dissolved in a solvent: for instance, sodium in liquid ammonia, sodium napthalemide in tetrahydrofuran (THF), or the potassium salt of the benzoin dianion in DMSO. Reduction of the fluorinated polymer surface results in the release of fluoride anions, which are washed off as sodium fluoride or potassium fluoride, dissolved in the reduction liquid.

Further, such treatments may result in undesirable roughening of the fluorinated polymer surface. Yet further, such treatments may introduce contaminants that impact on the performance of devices such as OTFTs.

So-called plasma treatments represent a second approach to the modification of fluorinated polymer surfaces. It is known, for instance, that PTFE surfaces become water-wettable after short (10-20 second) treatments in either oxygen or argon plasma. It is also known that the adhesion of a vacuum deposited gold film on Teflon® increases after these treatments. Oxygen plasma is said to introduce C=O, —CH$_2$, and —CHF groups onto the PTFE surface [Kinbara et al., Journal of Adhesion Science and Technology 7, No. 5 p. 457-66 (1993)].

In another study, Inagaki et al [Journal of Adhesion Science and Technology 3, No. 8, p. 637-49 (1989)] studied the effect of NH$_3$-plasma treatments on PTFE surfaces. Water contact angles as low as 16 degrees were observed and it was reported that extensive defluorination had occurred, accompanied by the formation of carbonyl and amide surface groups.

The use of reactive silanes (e.g. 3-aminopropylethoxysilane) in a plasma process has also been investigated. It has been reported that the reactive silanes can be covalently coupled to the surface of inert fluoropolymers such as PTFE and may subsequently act as an adhesion promoter ("Cold Gas Plasma and Silanes", by S. L. Kaplan, Fourth International Symposium on Silanes and Other Coupling Agents, Jun. 11-13, 2003, Orlando, Fla.).

The use of fluorosurfactants has been investigated in another general type of approach to the modification of fluorinated polymer surfaces.

For instance, it is known that Zonyl FSN, an adhesion promoter made by Du Pont, can help other films adhere to the fluoropolymer TFE AF. U.S. Pat. No. 5,403,437 discloses that by adding 5% ZFSNF to a photoresist solution and applying the photoresist on TFE AF at 70° C., coverage of approximately 98% can be obtained. Full coverage was said to be obtained by applying the photoresist solution twice.

Also, polymeric fluorocarbon surfactants such as poly(N-vinyldextranaldonamide-co-N-vinylperfluoroundecanamide), in which hydrophilic dextran oligosaccharides and hydrophobic perfluoroundecanoyl groups are incorporated sequentially onto a poly(vinylamine) backbone, have been shown to display stable surfactant adsorption and adhesion on PTFE surfaces [S. Wang et al., Macromolecules 37(9), p. 3353-3359 (2004)].

A problem associated with the fluorosurfactant methods is that the use of (liquid) fluorosurfactant molecules can potentially result in diffusion of the surfactant molecules into the active layers in electronic devices (e.g. the OSC layer in OTFTs).

Thus, there is a need for a surface modification technique for fluorinated polymer surfaces, which does not suffer from, or at least reduces the effect of the disadvantages associated with previous techniques.

SUMMARY OF THE INVENTION

A first aspect of the invention provides a method of modifying a fluorinated polymer surface comprising the steps of:
depositing a first or wetting layer on at least a portion of the fluorinated polymer surface, the wetting layer comprising a first polymer, it being a perfluorinated aromatic polymer; and
depositing a second layer on at least a portion of the wetting layer, the second layer comprising a second polymer, the second polymer being an aromatic polymer having a lower degree of fluorination than the first polymer, whereby the second layer provides a surface on to which a substance having a lower degree of fluorination than the first polymer e.g. a non-fluorinated substance is depositable.

Preferably, the second polymer is a non-fluorinated polymer.

The perfluorinated aromatic polymer may be selected from poly(pentafluorostyrene-co-glycidylmethacrylate), poly(pentafluorostyrene) and polystyrene-co-pentafluorostyrene.

The non-fluorinated aromatic polymer may be selected from poly(styrene-co-glycidyl methacrylate), polystyrene, polyimides, polybenzocyclobutenes (BCB), polyvinylphenol and polyvinylpyridine.

The wetting layer is selected according to a number of criteria. First, the wetting layer needs to display good adhesion to a fluorinated polymer surface such as PTFE, particularly in the dry.

PTFE is an example of a perfluorinated saturated polymer. It was realized that a perfluorinated aromatic polymer may be sufficiently similar to PTFE that such a polymer would stick on a PTFE surface.

The wetting layer comprising a perfluorinated aromatic polymer, e.g. poly(pentafluorostyrene), may then act as an anchoring layer for subsequently-deposited non-fluorinated aromatic polymers or molecules.

Specific perfluoroarene-arene interactions cause such subsequently-deposited non-fluorinatated aromatic polymers or molecules to stick to the wetting layer.

Perfuoroarene-arene interactions are non-covalent and occur between aromatic p-systems. Aromatic rings typically possess a quadropole moment which can be modified by introducing electron-donating or electron-withdrawing substituents. For instance, when all six protons of benzene are replaced by six electronegative fluorine atoms, it has been found that the quadrupole moment of benzene ($QC_6H_6 = -29 \times 10^{-40}$ $Cm^{-2}$) changes to the quadrupole moment of hexafluorobenzene, which is similar in magnitude but of opposite sign ($QC_6F_6 = 32 \times 10^{-40}$ $Cm^{-2}$) [M. R. Battaglia et al., Chem. Phys. Lett. 78, 421 (1981)].

It has been reported that perfluroarene-arene interactions may result in a crystalline complex exhibiting nearly parallel molecules, stacked alternately in infinite columns [J. H. Williams, J. K. Cockcroft, A. N. Fitch. Angew. Chem., Int. Ed. Engl. 31, 1655 (1992)].

Advantageously, therefore, the wetting layer may exhibit good adhesion both to the PTFE substrate and to subsequently deposited layers comprising aromatic, non-fluorinated polymers and/or molecules.

Further, it will be appreciated that the present invention does not rely on a chemical modification of the fluorinated polymer surface, e.g. by immersion in a chemically highly reactive, unstable and potentially dangerous solution.

Preferably, the wetting layer may be deposited using a solution deposition technique such as spin coating or inkjet printing. The concentration of perfluorinated aromatic polymer in the solution so deposited is preferably less that about 5 w/w %. More preferably, the concentration of perfluorinated aromatic polymer in the solution is less than about 1 w/w %, e.g. about 0.2 w/w %.

The second layer comprises a non-fluorinated aromatic polymer which is deposited on to at least a portion of the wetting layer may be deposited using a solution deposition technique such as spin coating. The concentration of non-fluorinated aromatic polymer in the solution so deposited is preferably less that about 5 w/w %. More preferably, the concentration of non-fluorinated aromatic polymer in the solution is less than about 1 w/w %, e.g. about 0.2 w/w %.

One or more additional layers may be deposited on to said further layer comprising a non-fluorinated aromatic polymer, preferably using a solution deposition technique such as spin coating. The one or more additional layers may further modify the surface energy. Additionally or alternatively, layers containing successively more polar and/or less conjugated polymers may be deposited.

When using solution deposition techniques such as spin coating in accordance with the present invention, it is important to select an appropriate solvent.

When depositing the wetting layer, the selected solvent system typically will need to contain a large proportion of a fluorinated solvent, in order to ensure good wetting on the fluorinated polymer surface. However, there is a risk that a fully fluorinated solvent system with good wetting properties on the fluorinated polymer surface could dissolve the fluorinated polymer under-layer. Also, any residual fluorinated solvent that remains in the wetting layer after deposition may have an adverse effect on the perfluoroarene-arene interactions required for the subsequent deposition of layers containing non-fluorinated aromatic polymers.

Accordingly, a solvent mixture comprising a non-fluorinated solvent (e.g. MEK or chloroform) may be preferred. In particular, the perfluorinated aromatic polymer may be dissolved in a mixture of a fluorinated (e.g. hexafluorobenzene) and a non-fluorinated solvent. The ratio by volume of fluorinated to non-fluorinated solvent may be around 2:1.

Alternative examples of fluoro/non-fluoro solvent pairs include /octafluorotoluene:chloroform and perfluorobenzene/methyl ethyl ketone (MEK).

The ratio of fluorinated to non-fluorinated solvent may be between 5:1 and 1:5, preferably between 5:1 and 1:1.

The preferred concentration ratios depend on the solubility of the fluorinated polymer in the fluorinated solvent component. For example, if the fluorinated polymer is highly soluble, a higher content of non-fluorinated solvent is required in order to preserve the integrity of the fluoropolymer layer.

Preferably, the non-fluorinated solvent may have a lower boiling point than the fluorinated solvent.

The fluorinated and the non-fluorinated solvents need to be completely miscible at all concentration ratios that occur during the spin-coating process. For instance, initially, the fluorinated component may be predominant in order to ensure good wetting of the solution on the fluorinated polymer surface. However, the mixture will typically contain a sufficiently high non-fluorinated solvent content to protect the fluorinated polymer under-layer from dissolving in the solvent mixture.

The concentration ratio of fluorinated to non-fluorinated solvents may change during drying. Preferably, the non-fluorinated solvent component may have a lower boiling point as compared to the fluorinated solvent component. Hence, during drying, the non-fluorinated solvent component will evaporate faster, resulting in a relative enrichment of the fluorinated component within the mixture. This enrichment of the fluorinated component may result in an increase in the solubility of the fluorinated polymer under-layer in the solution of the perfluorinated aromatic polymer during drying. Advantageously, this may allow for the creation of a graded or mixed interface and consequently improved adhesion of the wetting layer to the fluorinated polymer surface.

A second aspect of the invention provides an electronic device, preferably a TFT, having a substrate comprising a fluorinated polymer and a plurality of successive layers located thereon, the uppermost being absent of fluorine.

Preferably a non-fluorinated substance may be located on, e.g. adhered to, the top layer.

A further or more particular aspect of the invention provides an electronic device, preferably a thin film transistor, comprising:
an insulating layer containing a fluorinated polymer;
a first or wetting layer covering at least a portion of the insulating layer, the wetting layer comprising a perfluorinated aromatic polymer;
a second layer covering at least a portion of the wetting layer and comprising a second polymer having a lower degree of fluorination than the first polymer, e.g. a non-fluorinated aromatic polymer; and
at least one portion comprising a non-fluorinated substance;
wherein the wetting layer and the further layer together make up an adhesion layer between the insulating layer and the or each portion comprising the non-fluorinated substance.

Preferably, the or each portion comprising the non-fluorinated substance may comprise an electrode, e.g. a gate electrode.

For instance, the invention may advantageously permit the direct inkjet printing of the gate electrodes onto the adhesion layer during the fabrication of a top gate OTFT.

Further, in cases where the etching rate of the gate electrode material is significantly lower than that of the insulating layer and the underlying semiconductor, e.g. OSC, layer, the inkjet-printed gate electrodes may subsequently be used as etchmasks for the patterning of the fluorinated and semiconductor layers by a plasma dry-etching process.

Preferably, the first polymer is selected from the group: poly(pentafluorostyrene-co-glycidylmethacrylate), poly (pentafluorostyrene), polystyrene-co-pentafluorostyrene.

Preferably, the second polymer is selected from the group: wherein the second polymer is selected from the group: poly (styrene-co-glycidyl methacrylate), polystyrene, polyimides, polybenzocyclobutenes (BCB), polyvinylphenol, polyvinylpyridine.

In some embodiments, the device may further comprise one or more further layers, e.g. a third layer, between the second layer and the or each one portion comprising a non-fluorinated substance, wherein the further or third layer may comprise a third polymer having lower conjugation and/or greater polarity than the second polymer.

Another aspect of the invention provides a method of manufacture of an electronic device, wherein the electronic device comprises a fluorinated polymer surface, comprising:
providing a part of the device having a fluorinated polymer surface;
depositing a first or wetting layer on to at least a portion of the fluorinated polymer surface, the wetting layer comprising a first polymer, it being a substantially perfluorinated aromatic polymer;
depositing a second layer covering at least a portion of the wetting layer and comprising a second polymer, the second polymer being an aromatic polymer having a lower degree of fluorination than the first polymer, wherein the wetting layer and the second layer together make up an adhesion layer between the insulating layer and a non-fluorinated substance; and
depositing at least one compound containing a substance having a lower degree of fluorination than the first polymer, e.g. a non-fluorinated substance, on to at least a portion of the adhesion layer.

Advantageously, the invention may be usefully applied to encapsulate devices that have a fluorinated polymer outer or top surface.

A further aspect of the invention provides a method of depositing a fluorine-containing polymer onto a fluorinated surface, the method comprises dissolving the fluorine-containing polymer in a solvent mixture containing a fluorinated solvent species and a non-fluorinated solvent species, the non-fluorinated solvent species having, preferably, a lower boiling point than the fluorinated solvent species, and contacting the dissolved fluorine-containing polymer with the fluorinated surface to form a layer of the fluorine-containing polymer on the fluorinated surface.

BRIEF DESCRIPTION OF THE DRAWINGS

In order that the invention may be more fully understood, it will now be described by way of example only with reference to the accompanying drawings, in which.

DETAILED DESCRIPTION

Example 1

In this example poly(pentafluorostyrene-co-glycidyl methacrylate) was deposited by spin-coating on to a fluorinated polymer surface.

Figure 1:
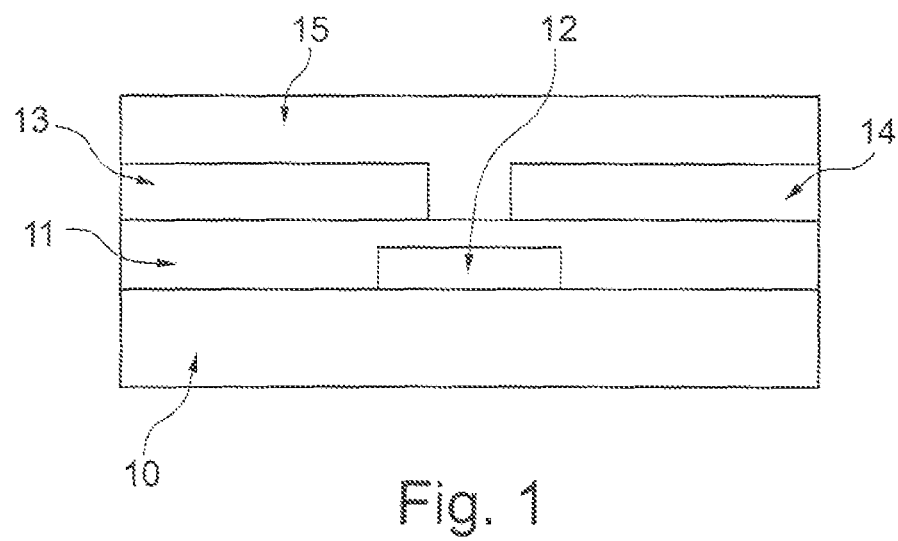
FIG. 1 shows the general architecture of a bottom-gate organic thin film transistor (OTFT).
Figure 2:
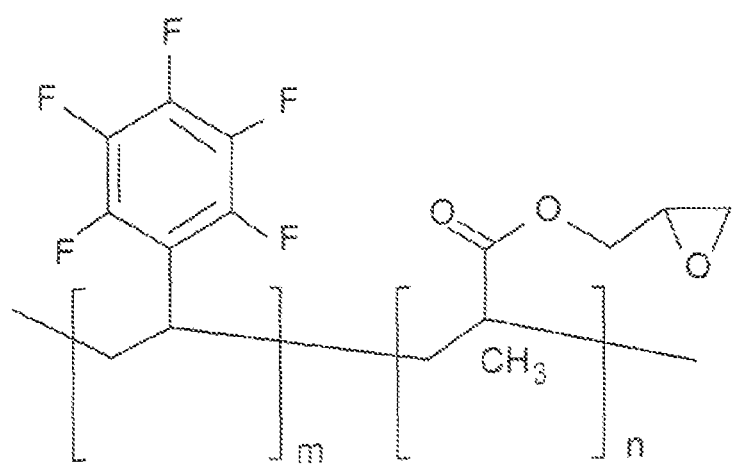
FIG. 2 shows the chemical structure of poly(pentafluorostyrene-co-glycidyl methacrylate).

Poly(pentafluorostyrene-co-glycidyl methacrylate) is a copolymer comprising predominantly pentafluorophenyl groups, the glycidyl methacrylate fraction is only around 10%. The structure of poly(pentafluorostyrene-co-glycidyl methacrylate) is shown in FIG. 2.

A fluorinated polymer surface was prepared by spin coating a 2% PTFE solution in a 1:1 mixture of FC-70 (perfluorotripentylarine) and FC-75 (perfluoro-2-n-butyl THF) (both supplied by 3M) on to a glass substrate. Spin coating was carried out at 1000 rpm for a period of 20 seconds. This was followed by annealing at 100° C. in air for a period of 10 minutes.

Three poly(pentafluorostyrene-co-glycidyl methacrylate) solutions were prepared, in which: (i) poly(pentafluorostyrene-co-glycidyl methacrylate) was dissolved in hexafluorobenzene; (ii) poly(pentafluorostyrene-co-glycidyl methacrylate) was dissolved in a 2:1 (by volume) mixture of hexafluorobenzene and chloroform; and (iii) poly(pentafluorostyrene-co-glycidyl methacrylate) was dissolved in chloroform.

The poly(pentafluorostyrene-co-glycidyl methacrylate) solutions were each spin-coated on to the fluorinated polymer surface. Spin coating was carried out at 1000 rpm for a period of 60 seconds. This was followed by annealing at 100° C. in air for a period of 10 minutes.

Spin-coating of poly(pentafluorostyrene-co-glycidyl methacrylate) from the hexafluorobenzene/chloroform mixture resulted in the formation of a high-quality film on top of the fluorinated polymer surface.

It was also found that spin-coating of poly(pentafluorostyrene-co-glycidyl methacrylate) from hexafluorobenzene resulted in a rough film. This was probably due to partial dissolution of the fluorinated polymer surface by the hexafluorobenzene during the drying process.

By way of comparison, it was found that spin-coating on to the fluorinated polymer surface of poly(pentafluorostyrene-co-glycidyl methacrylate) from chloroform was not possible, due to complete de-wetting between the solution and the fluorinated polymer surface.

Accordingly, it will be appreciated that spin-coating of poly(pentafluorostyrene-co-glycidyl methacrylate) from the hexafluorobenzene/chloroform mixture gave the best results.

Whilst we do not wish to be bound by any theory, we believe that this can be explained as follows. During the initial stages of the spin-coating process, the chloroform component, i.e. the non-fluorinated component, prevents the fluorinated polymer surface from being dissolved, while the hexafluorobenzene (the fluorinated component) content of the solution is sufficiently high to ensure good wetting of the polymer solution on the fluorinated polymer surface.

Chloroform has a lower boiling point (62.3° C.) than hexafluorobenzene (82° C.). Accordingly, the chloroform evaporates faster than the hexfluorobenzene, thereby preventing precipitation of the poly(pentafluorostyrene-co-glycidyl methacrylate) polymer during the drying process. As the chloroform evaporates, the solvent will become relatively richer in hexafluorobenzene and may consequently partially dissolve the fluorinated polymer surface. This may result in intermixing of the fluorinated polymer the poly(pentafluorostyrene-co-glycidyl methacrylate) polymer, which may further improve adhesion of the poly(pentafluorostyrene-co-glycidyl methacrylate) to the fluorinated polymer surface.

In a further stage of the experiment, a non-fluorinated aromatic polymer, namely polystyrene, was deposited on to a poly(pentafluorostyrene-co-glycidyl methacrylate) layer, which itself was deposited on to the fluorinated polymer surface. A diluted solution of polystyrene in toluene was spin-coated at 1000 rpm for a period of 60 seconds on to the poly(pentafluorostyrene-co-glycidyl methacrylate) layer. No de-wetting of the polystyrene layer was observed during spin-coating and annealing at temperatures up to 100° C.

Example 2

This example is similar to Example 1 insofar as it involved the deposition of a poly(pentafluorostyrene-co-glycidyl methacrylate) wetting layer on to a fluorinated polymer surface.

In this example, however, a small non-fluorinated aromatic molecule, namely triisopropylsilylethynyl (TIPS) pentacene, was deposited on to the poly(pentafluorostyrene-co-glycidyl methacrylate) layer. As compared with polystyrene, TIPS pentacene can more easily be observed due to its intense color and crystallinity.

In a first experiment, TIPS pentacene dissolved in toluene was spin-coated on to the poly(pentafluorostyrene-co-glycidyl methacrylate) layer at 1000 rpm for a period of 60 seconds.

Spin-coating of TIPS pentacene from toluene resulted in a thin, faint blue TIPS pentacene film being formed. Localized film defects were observed, possibly due to some dissolution of the poly(pentafluorostyrene-co-glycidyl methacrylate) wetting layer in the TIPS pentacene/toluene solution during spin-coating.

In a further experiment, TIPS pentacene dissolved in tetralin was spin-coated on to the poly(pentafluorostyrene-co-glycidyl methacrylate) layer at 1000 rpm for a period of 60 seconds.

In this case, complete de-wetting of the poly(pentafluorostyrene-co-glycidyl methacrylate) wetting layer from the fluorinated polymer surface was observed, possibly due to the comparatively slow evaporation of tetralin, thereby allowing for the dissolution of the wetting layer in the tetralin.

Accordingly, it will be appreciated that the solution from which the non-fluorinated aromatic polymer or molecule is spin-coated should preferably evaporate relatively quickly.

As well as, or instead of, toluene, other suitable solvents may include hexane, heptane, octane, cyclohexane, tetrahydrofurane, xylene, mesitylene, 4-methoxybenzene or chlorobenzene.

Other suitable fluorinated polymer surfaces may include perfluoro cyclo oxyaliphatic polymer (CYTOP), perfluoroalkoxy polymer resin (PFA), fluorinated ethylene-propylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez® or Tecnoflon®, fluoro elastomers such as Viton®, Perfluoropolyether (PFPE) and a polymer of tetrafluoroethylene, hexafluoropropylene and vinylidene fluoride (THV).

In some embodiments, other layers may be provided between the adhesion layers and the non-fluorinated layer of the electronic device. Other layers may be provided in other parts of the structure.

The invention may be used in other fields where a fluorine gradient is required (i.e. the degree of fluorination changes, e.g. becomes lower or higher, as you move across a structure). Thus the concept could be used to increase the fluorine concentration as one moves away from a non-fluorinated structure.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of modifying a fluorinated polymer surface comprising the steps of:
   depositing a first layer on at least a portion of a fluorinated polymer surface, the first layer comprising a first polymer, the first polymer being a substantially perfluorinated aromatic polymer, wherein the first layer is deposited using a solution deposition technique; and
   depositing a second layer on at least a portion of the first layer, the second layer comprising a second polymer, the second polymer being an aromatic polymer having a lower degree of fluorination than said first polymer, whereby the second layer provides a surface on to which a substance having a lower degree of fluorination than the first polymer is depositable, wherein the first polymer is dissolved in a first solvent system comprising a fluorinated solvent and a non-fluorinated solvent and the ratio of fluorinated solvent:non-fluorinated solvent in the first solvent system is 5-1:1-5.

2. A method according to claim 1 wherein the second polymer comprises a non-fluorinated aromatic polymer.

3. A method according to claim 1 wherein the fluorinated solvent is selected from the group consisting of hexafluorobenzene and octafluorotoluene.

4. A method according to claim 1 wherein the non-fluorinated solvent is selected from the group consisting of chloroform and methyl ethyl ketone.

5. A method according to claim 1 wherein the non-fluorinated solvent has a lower boiling point than the boiling point of the fluorinated solvent.

6. A method according to claim 1 wherein the concentration of the first polymer in the first solvent system is less than about 5 w/w.

7. A method according to claim 6 wherein the concentration of the first polymer in the first solvent system is less than about 1 w/w %.

8. A method according to claim 7 wherein the concentration of the first polymer in the first solvent system is about 0.2 w/w %.

9. A method according to claim 1, wherein the first polymer is selected from the group consisting of poly(pentafluorostyrene-co-glycidylmethacrylate), poly(pentafluorostyrene), and polystyrene-co-pentafluorostyrene.

10. A method according to claim 1, comprising depositing the second layer using a solution deposition technique.

11. A method according to claim 10 wherein the second polymer is dissolved in a second solvent system.

12. A method according to claim 11 wherein the concentration of the second polymer in the second solvent system is less than about 5 w/w %.

13. A method according to claim 12 wherein the concentration of the second polymer in the second solvent system is less than about 1 w/w %.

14. A method according to claim 13 wherein the concentration of the second polymer in the second solvent system is about 0.2 w/w %.

15. A method according to claim 10, comprising depositing the second layer using spin coating or inkjet printing.

16. A method according to claim 1, wherein the second polymer is selected from the group consisting of poly(styrene-co-glycidyl methacrylate), polystyrene, polyimides, polybenzocyclobutenes (BCB), polyvinylphenol, and polyvinylpyridine.

17. A method according to claim 1 comprising depositing a third layer on at least a portion of the second layer, the third layer comprising a third polymer having lower conjugation and/or greater polarity than the second polymer.

18. A method according to claim 17, comprising depositing the third layer using a solution deposition technique.

19. A method according to claim 18, comprising depositing the third layer using spin coating or inkjet printing.

20. A method according to claim 1 wherein the substance having a lower degree of fluorination than the first polymer is a non-fluorinated substance.

21. A method according to claim 1 comprising depositing the first layer using spin coating or inkjet printing.

22. A method according to claim 1 wherein the ratio of fluorinated solvent:non-fluorinated solvent in the first solvent system is 5-1:1.

23. An electronic device comprising:
an insulating layer containing a fluorinated polymer;
a first layer covering at least a portion of the insulating layer, the first layer comprising a first polymer which comprises a substantially perfluorinated aromatic polymer;
a second layer covering at least a portion of the first layer and comprising a second polymer having a lower degree of fluorination than the first polymer; and
at least one portion comprising a non-fluorinated substance;
a third layer between the second layer and the or each one portion comprising a non-fluorinated substance;
wherein the first layer and the second layer together make up at least part of an adhesion layer between the insulating layer and the or each portion comprising the non-fluorinated substance and the third layer comprises a third polymer having lower conjugation and/or greater polarity than the second polymer.

24. An electronic device according to claim 23, wherein the second polymer is selected from the group consisting of poly(styrene-co-glycidyl methacrylate), polystyrene, polyimides, polybenzocyclobutenes (BCB), polyvinylphenol, and polyvinylpyridine.

25. An electronic device according to claim 23, wherein the electronic device is a thin film transistor.

26. An electronic device comprising:
an insulating layer containing a fluorinated polymer;
a first layer covering at least a portion of the insulating layer, the first layer comprising a first polymer which comprises a substantially perfluorinated aromatic polymer;
a second layer covering at least a portion of the first layer and comprising a second polymer having a lower degree of fluorination than the first polymer; and
at least one portion comprising a non-fluorinated substance;
wherein the first layer and the second layer together make up at least part of an adhesion layer between the insulating layer and the or each portion comprising the non-fluorinated substance, wherein the first polymer is selected from the group consisting of poly(pentafluorostyrene-co-glycidylmethacrylate), poly(pentafluorostyrene), and polystyrene-co-pentafluoro styrene.

27. A method of manufacturing an electronic device, wherein the electronic device comprises an insulating layer having a fluorinated polymer surface, the method comprising:
depositing a first layer on to at least a portion of the fluorinated polymer surface, the first layer comprising a first polymer, the first polymer being a substantially perfluorinated aromatic polymer;
depositing a second layer covering at least a portion of the first layer and comprising a second polymer, the second polymer being an aromatic polymer having a lower degree of fluorination than the first polymer, wherein the first layer and the second layer together make up at least part of an adhesion layer between the insulating layer and a non-fluorinated substance; and
depositing at least one compound containing a non-fluorinated substance on to at least a portion of the adhesion layer, wherein the first polymer is selected from the group consisting of poly(pentafluorostyrene-co-glycidylmethacrylate), poly(pentafluorostyrene) and polystyrene-co-pentafluoro styrene.

28. A method according to claim 27 wherein the second polymer comprises a non-fluorinated aromatic polymer.

29. A method according to claim 27 comprising depositing the first layer using a solution deposition technique.

30. A method according to claim 29, wherein the first polymer is dissolved in a first solvent system comprising a fluorinated solvent and a non-fluorinated solvent.

31. A method according to claim 30 wherein the ratio of fluorinated solvent:non-fluorinated solvent in the first solvent system is 5-1:1-5.

32. A method according to claim 30 wherein the fluorinated solvent is selected from the group consisting of hexafluorobenzene and octafluorotoluene.

33. A method according to claim 30 wherein the non-fluorinated solvent is selected from the group consisting of chloroform and methyl ethyl ketone.

34. A method according to claim 30, wherein the non-fluorinated solvent has a lower boiling point than the fluorinated solvent.

35. A method according to claim 30 wherein the concentration of the first polymer in the first solvent system is less than about 5 w/w %.

36. A method according to claim 35 wherein the concentration of the first polymer in the first solvent system is less than about 1 w/w %.

37. A method according to claim 36 wherein the concentration of the first polymer in the first solvent system is about 0.2 w/w %.

38. A method according to claim 29, comprising depositing the first layer using spin coating or inkjet printing.

39. A method according to claim 27, comprising depositing the second layer using a solution deposition technique.

40. A method according to claim 39 wherein the second polymer is dissolved in a second solvent system.

41. A method according to claim 40 wherein the concentration of the second polymer in the second solvent system is less than about 5 w/w %.

42. A method according to claim 41 wherein the concentration of the second polymer in the second solvent system is less than about 1 w/w %.

43. A method according to claim 42 wherein the concentration of the second polymer in the second solvent system about 0.2 w/w %.

44. A method according to claim 27, wherein the second polymer is selected from the group consisting of poly(styrene-co-glycidyl methacrylate), polystyrene, polyimides, polybenzocyclobutenes (BCB), polyvinylphenol and polyvinylpyridine.

45. A method according to claim 27 comprising depositing a third layer on at least a portion of the second layer, the third layer comprising a third polymer having lower conjugation and/or greater polarity than the second polymer, wherein the third layer comprises part of the adhesion layer.

46. A method according to claim 45, comprising depositing the third layer using a solution deposition technique.

47. A method according to claim 46, comprising depositing the third layer using spin coating or inkjet printing.

48. A method of depositing a fluorine-containing polymer onto a fluorinated surface, the method comprising:
dissolving the fluorine-containing polymer in a solvent mixture containing a fluorinated solvent species and a non-fluorinated solvent species; and
contacting the dissolved fluorine-containing polymer with the fluorinated surface to form a layer of the fluorine-containing polymer on the fluorinated surface,
wherein the non-fluorinated solvent species has a lower boiling point than the fluorinated solvent species.

49. A method according to claim 48 wherein the ratio of fluorinated solvent:non-fluorinated solvent is 5-1:1-5.

50. A method according to claim 49 wherein the ratio of fluorinated solvent:non-fluorinated solvent is 5-1:1.

51. A method according to claim 48 wherein the fluorinated solvent is selected from the group consisting of hexafluorobenzene and octafluorotoluene.

52. A method according to claim 48 wherein the non-fluorinated solvent is selected from the group consisting of chloroform and methyl ethyl ketone.

53. A method according to claim 48 wherein the concentration of the fluorine containing polymer in the first solvent system is less than about 5 w/w %.

54. A method according to claim 53 wherein the concentration of the fluorine containing polymer in the first solvent system is less than about 1 w/w %.

55. A method according to claim 54 wherein the concentration of the fluorine containing polymer in the first solvent system about 0.2 w/w %.

56. A method according to claim 48, wherein the fluorine containing polymer is selected from the group consisting of poly(pentafluorostyrene-co-glycidylmethacrylate), poly(pentafluoro styrene) and polystyrene-co-pentafluoro styrene.

* * * * *